(12) United States Patent
Sartler et al.

(10) Patent No.: US 10,476,381 B1
(45) Date of Patent: Nov. 12, 2019

(54) POWER CONVERSION SYSTEM AND FILTER THEREFOR

(71) Applicant: Rockwell Automation Technologies, Inc., Mayfield Heights, OH (US)

(72) Inventors: Christian S. Sartler, Milwaukee, WI (US); Jeremy J. Keegan, West Bend, WI (US); James A. Ulrich, Hartland, WI (US); Amanda D. Steven, Wauwatosa, WI (US); Lixiang Wei, Mequon, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 16/188,647

(22) Filed: Nov. 13, 2018

(51) Int. Cl.
*H02M 1/44* (2007.01)
*H02M 5/458* (2006.01)
*H03H 7/01* (2006.01)
*H02P 27/08* (2006.01)
*H02M 7/00* (2006.01)

(52) U.S. Cl.
CPC ........... *H02M 1/44* (2013.01); *H02M 5/4585* (2013.01); *H03H 7/0115* (2013.01); *H03H 7/0138* (2013.01); *H03H 7/1741* (2013.01); *H02M 7/003* (2013.01); *H02P 27/08* (2013.01); *H03H 2007/013* (2013.01); *H03H 2250/00* (2013.01)

(58) Field of Classification Search
CPC ........ H02M 1/44; H02M 5/453; H02M 5/458; H02M 5/4585; H02M 7/003; H03H 2250/00; H03H 7/1741; H03H 7/0138; H03H 2007/013; H03H 7/0115; H02P 27/08
See application file for complete search history.

(56) References Cited

U.S. PATENT DOCUMENTS

2015/0171817 A1* 6/2015 Sun ................. H02M 1/126
    307/9.1
2015/0253052 A1* 9/2015 Sauer .................. H02M 1/44
    318/400.3

(Continued)

OTHER PUBLICATIONS

A. F. Moreira, T. A. Lipo, G. Venkataramanan and S. Bernet, "Modeling and Evaluation of dv/dt Filters for AC Drives with High Switching Speed", 9th European Conference on Power Electronics and Applications, Graz, Austria, Aug. 2001.

M.M. Swamy and M.A. Baumgardner, "New normal dv/dt filter with a built-in resistor failure detection circuit", IEEE Trans. Ind. Appl., vol. 53, No. 3, pp. 2149-2158, May/Jun. 2017.

(Continued)

*Primary Examiner* — Fred E Finch, III
(74) *Attorney, Agent, or Firm* — Fay Sharpe LLP

(57) ABSTRACT

Power conversion systems and filters therefor include conductive busbars, a first low frequency capacitor circuit coupled with the busbars at a first location proximate a filter input, a first inductor circuit with common mode cores extending around the busbars at a second location between the first location and a filter output, a second low frequency capacitor circuit coupled with the busbars at a third location between the second location and the filter output, a second inductor circuit with second common mode cores extending around the busbars at a fourth location between the third location and the filter output, a third low-frequency capacitor circuit coupled with the busbars at a fifth location between the fourth location and the filter output, and a high frequency fourth capacitor circuit, coupled with one of the busbars at the fifth location.

20 Claims, 7 Drawing Sheets

(56) References Cited

U.S. PATENT DOCUMENTS

| | | | | |
|---|---|---|---|---|
| 2016/0164448 A1* | 6/2016 | Kane | .................. | H02P 27/06 |
| | | | | 318/400.24 |
| 2017/0012594 A1* | 1/2017 | Westmoreland | ........ | H02M 1/44 |
| 2017/0047881 A1* | 2/2017 | Shimura | ................. | H02P 29/50 |
| 2017/0230027 A1* | 8/2017 | Oswald | ................. | H03H 7/06 |
| 2018/0007785 A1* | 1/2018 | Kamikura | ............ | H02M 5/458 |
| 2018/0026525 A1* | 1/2018 | Gardner | ................. | H02M 1/44 |
| | | | | 333/181 |
| 2018/0041035 A1* | 2/2018 | Ying | ................. | H02J 3/1864 |
| 2018/0049314 A1* | 2/2018 | Amaducci | ............... | H03H 1/00 |
| 2018/0068779 A1* | 3/2018 | Wennerstrom | ...... | H01F 27/2876 |
| 2018/0108472 A1* | 4/2018 | Pagenkopf | ........... | H01F 17/062 |
| 2018/0138849 A1 | 5/2018 | Royak et al. | | |
| 2018/0198261 A1* | 7/2018 | Wurzinger | ............... | H02B 1/20 |
| 2018/0342973 A1* | 11/2018 | Li | ......................... | H02M 1/44 |

OTHER PUBLICATIONS

Y. Liu, L. Wang, H. Gao, H. Zhang and D. Xu, "Overvoltage mitigation of submersible motors with long cables of different lengths", in Conf. Electrical Machines and Systems, 2014, pp. 638-644.

Z. Liu, G. Skibinski, "Method to Reduce Overvoltage on AC Motor Insulation from Inverters with Ultra-Long Cable", IEEE Electric Machines and Drives Conference (IEMDC), 2017.

José Rodríguez, , Jorge Pontt, César Silva, Rodrigo Musalem, Patricio Newman, René Vargas, andSergio Fuentes, "Resonances and Overvoltages in a Medium-Voltage Fan Motor Drive With Long Cables in an Underground Mine", IEEE Trans. Ind. Appl., vol. 42, No. 3, pp. 856-863 May/Jun. 2006.

Matt Smochek, Anthony F. Pollice, Mukul Rastogi, and Mark Harshman "Long Cable Applications From a Medium-Voltage Drives Perspective", IEEE Trans. Ind. Appl., vol. 52, No. 1, pp. 645-652, Jan./Feb. 2016.

* cited by examiner

US 10,476,381 B1

POWER CONVERSION SYSTEM AND FILTER THEREFOR

BACKGROUND INFORMATION

The subject matter disclosed herein relates to power conversion.

BRIEF DESCRIPTION

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present the concept of the disclosure in a simplified form prior to the more detailed description that is presented hereinafter. The present disclosure provides power conversion systems and filters therefor. The filter includes conductive busbars, a first low frequency capacitor circuit coupled with the busbars at a first location proximate a filter input, a first inductor circuit with common mode cores extending around the busbars at a second location between the first location and a filter output, a second low frequency capacitor circuit coupled with the busbars at a third location between the second location and the filter output, a second inductor circuit with second common mode cores extending around the busbars at a fourth location between the third location and the filter output, a third low-frequency capacitor circuit coupled with the busbars at a fifth location between the fourth location and the filter output, and a high frequency fourth capacitor circuit, coupled with one of the busbars at the fifth location.

DETAILED DESCRIPTION

Figure 1:
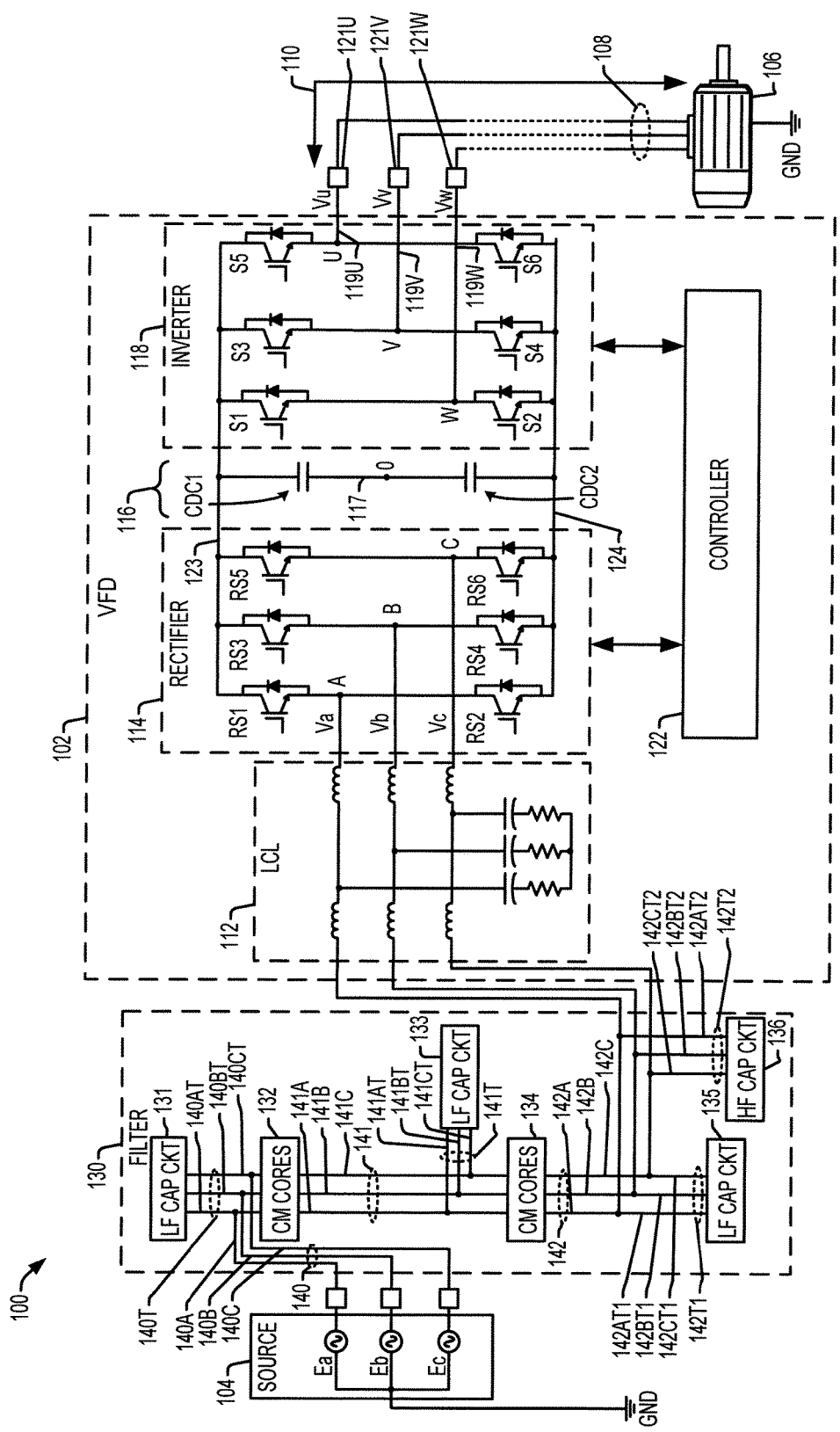
FIG. 1 is a schematic diagram.

Referring now to the figures, several embodiments or implementations are hereinafter described in conjunction with the drawings, wherein like reference numerals are used to refer to like elements throughout, and wherein the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows an example industrial power conversion system 100 with a motor drive 102 that receives and converts AC electrical input power from a source 104 to drive a motor load 106 through a motor cable 108 having a cable length 110. The example AC input and output of the converter 102 are three phase configurations. Other implementations are possible using any combination of single or multiphase inputs and outputs to drive a motor 106 or other type of load. The example motor drive 102 is a voltage source converter (VSC) motor drive, which includes an input filter 112, a rectifier 114, a DC bus circuit 116 with DC bus capacitors CDC1 and CDC2 that define a center node 117 (e.g., zero volts). The DC bus voltage of the bus circuit 116 drives an inverter 118 with an inverter output 119 (e.g., output phase lines 119U, 119V and 119W) connected to output terminals 121U, 121V and 121W to drive a load 106 through the cable 108. The motor drive 102 also includes a controller or control circuit 122 to provide switching control signals to the inverter 118, as well as rectifier switching control signals to an active front end (AFE) implementation of the rectifier 114 as shown in FIG. 1. In certain examples, an output filter and/or an output transistor (not shown) can be connected between the inverter output 119 and the motor cable 108, for example, to drive a motor load 106 through a cable 108 having a long length 110 four electronic submersible pump (ESP) applications. The DC bus circuit 116 includes a first DC power path or node 123, and a second DC power path or node 124.

The rectifier 114 includes a rectifier input A, B, C configured to receive a rectifier AC input signal Va, Vb, Vc, as well as a rectifier output configured to provide the DC voltage output signal to the DC bus circuit 116. In the illustrated example, the rectifier 114 is an active rectifier with rectifier switching devices RS1-RS6 coupled between the rectifier input A, B, C and the rectifier output. In other examples, a passive rectifier can be used (not shown). The power conversion system 100 also includes a filter 130 coupled between the source 104 and the motor drive 102. In the example of FIG. 1, the filter 112 operates as a second input filter connected between the filter output 142 and the rectifier input A, B, C, and which includes phase-specific L-C-L (inductor-capacitor-inductor) circuit components. In other implementations (e.g., FIG. 7 below) the second filter 112 can be omitted. The example three phase AC power source 104 provides AC phase voltage signals Ea, Eb and Ec through the filter 130 to the inputs of the input second filter 112, and the second filter 112 provides filtered AC input voltage signals Va, Vb and Vc to the respective phase input lines A, B and C of the rectifier 114. In one implementation (e.g., FIG. 4 below), the motor drive 102 includes a housing that encloses the second filter 112, the active rectifier 114, the DC bus circuit 116 at the inverter 118, along with the controller 122. In certain implementations, moreover, the filter 130 is housed within a multi-cabinet enclosure, and can be installed as an ad-on component to an existing cabinet-mounted motor drive (e.g., FIG. 4 below).

The filter 130 advantageously reduces or mitigates electromagnetic interference (EMI) emissions from the switching operation of the active front and rectifier 114 and/or the switching inverter 118, to protect the power source 104 against excessive EMI. In one example, the switching rectifier 114 and the inverter 118 operate at pulse width modulation (PWM) switching frequencies of several hundred hertz up to several kilohertz. In one example, the second filter 112 (when included) is designed to reduce or filter out all or at least a portion of the frequency content in the range of the pulse width modulation switching frequencies of the rectifier 114 and/or the inverter 118. The inverter 118 includes a DC input coupled with the DC bus circuit 116, and a plurality of inverter switching devices S1-S6 coupled between the DC input and the inverter output 119 The inverter switches S1-S6 are configured to operate according to inverter switching control signals from the controller 122 in order to provide an inverter output signal Vu, Vv, Vw at the inverter output 119 to directly or indirectly drive the load 106.

The inverter 118 switching devices S1-S6 are individually coupled between a corresponding one of the DC current paths 123 or 124 of the intermediate DC circuit 116 and a corresponding one of the AC output nodes 119U, 119V or 119W (also labelled U, V, and W in FIG. 1). The inverter switching devices S1-S6 are individually operative according to corresponding inverter switching control signals from the controller 122 in order to selectively electrically couple the corresponding DC current path with the corresponding AC output node. The controller 122 provides the inverter switching control signals in order to cause the inverter 118 to generate a controlled amplitude and frequency of the single or multiphase AC output signal used to drive a motor load 106. In this manner, the controller 122 can implement a variety of different motor control functions, including speed control, torque control, etc.

The rectifier 114 can be a passive rectifier including one or more diode rectifier components, or may be an active front end (AFE) system with one or more rectifier switching devices RS1, RS2, RS3, RS4, RS5 and RS6 (e.g., IGBTs, etc.). The example active rectifier switches RS1-RS6 are configured to operate according to rectifier switching control signals from the controller 122 to convert input AC electrical power to provide the DC bus voltage in the DC bus circuit 116. The rectifier switching devices RS1-RS6 are individually coupled between a corresponding one of the rectifier input nodes A, B, or C and a corresponding one of the first and second DC output nodes 123 or 124. In operation, the rectifier switching devices RS1-RS6 individually operate according to a corresponding rectifier switching control signal to selectively couple a corresponding rectifier input node A, B, or C with a corresponding DC output node 123 or 124 according to a corresponding rectifier switching control signal from the controller 122. The controller 122 provides the rectifier switching control signals in order to control conversion of AC input power received by the rectifier 114 into a controlled or regulated DC bus voltage in the DC bus circuit 116.

The illustrated motor drive 102 is a voltage source converter configuration including one or more capacitive storage elements in the DC bus circuit 116. The DC bus circuit 116 may include a single capacitor CDC or multiple capacitors (e.g., CDC1 and CDC2 in FIG. 1) connected in any suitable series, parallel and/or series/parallel configuration to provide a DC bus capacitance across the inverter input terminals. The intermediate DC bus circuit 116 in one example includes first DC current path 123 coupled with the first DC output node of the rectifier 114, and a second DC current path 124 coupled with the second DC output node of the rectifier 114.

The controller 122 in one example includes a processor and an associated electronic memory (not shown in FIG. 1) which stores program instructions to implement a closed loop control program to regulate or control one or more of voltage, current, speed, torque, etc. The controller 122 in certain embodiments implements a motor speed and/or position and/or torque control scheme in which the controller 122 selectively provides the switching control signals to the inverter switches S1-S6 in a closed and/or open-loop fashion according to one or more setpoint values such as a motor speed setpoint. The setpoint in one example is a signal or value generated by the controller 122, or a fixed setpoint value, or such setpoint value can be received from an external system (not shown). In practice, the motor drive 102 may also receive a torque setpoint and/or a position (e.g., angle) setpoint, and such desired signals or values (setpoint(s)) may be received from a user interface and/or from an external device such as a distributed control system, etc. (not shown). As used herein, a signal can be an analog signal, such as a current or a voltage signal, or a signal can include digital values generated or consumed by the controller 122.

Figure 2:
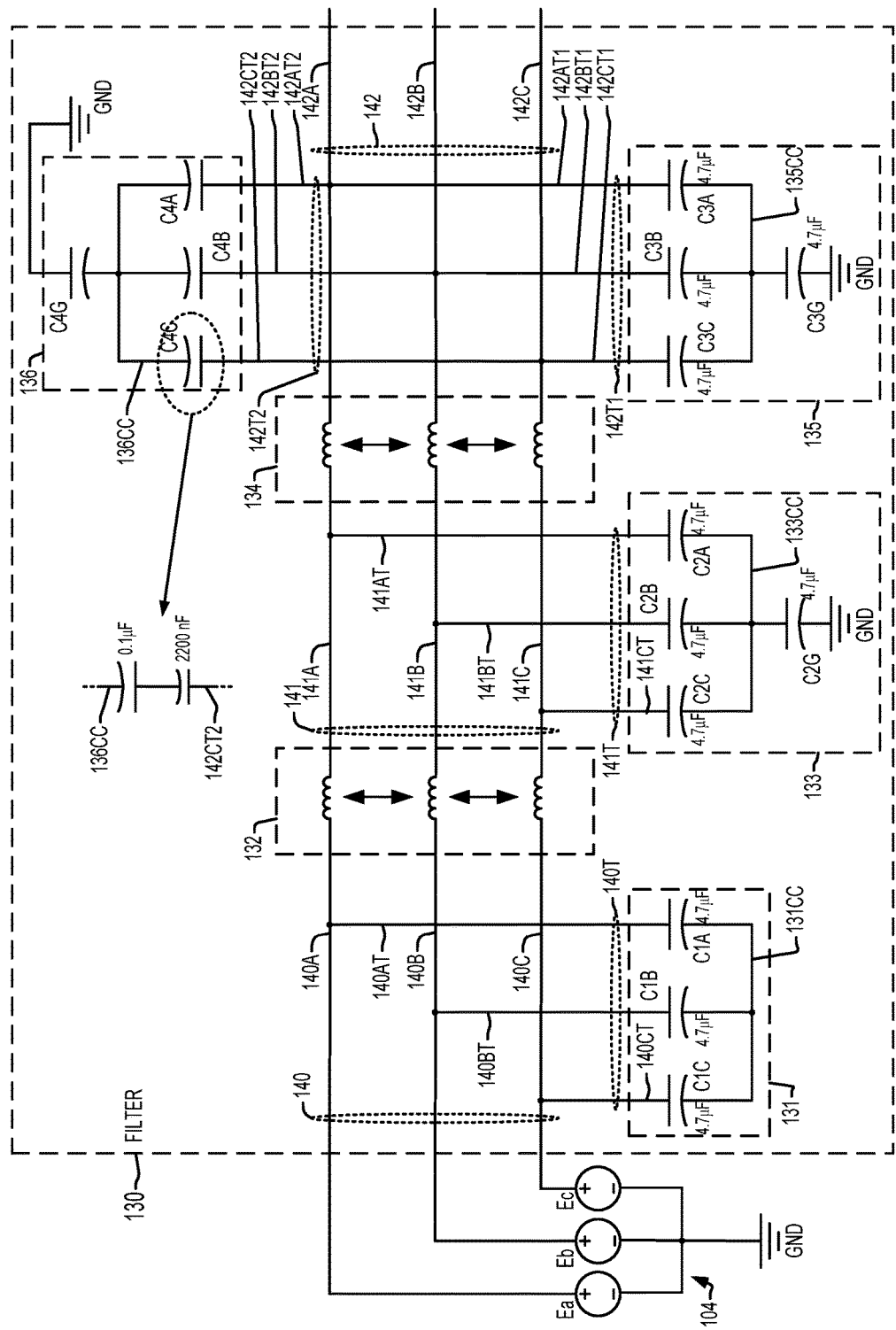
FIG. 2 is a schematic diagram.
Figure 3:
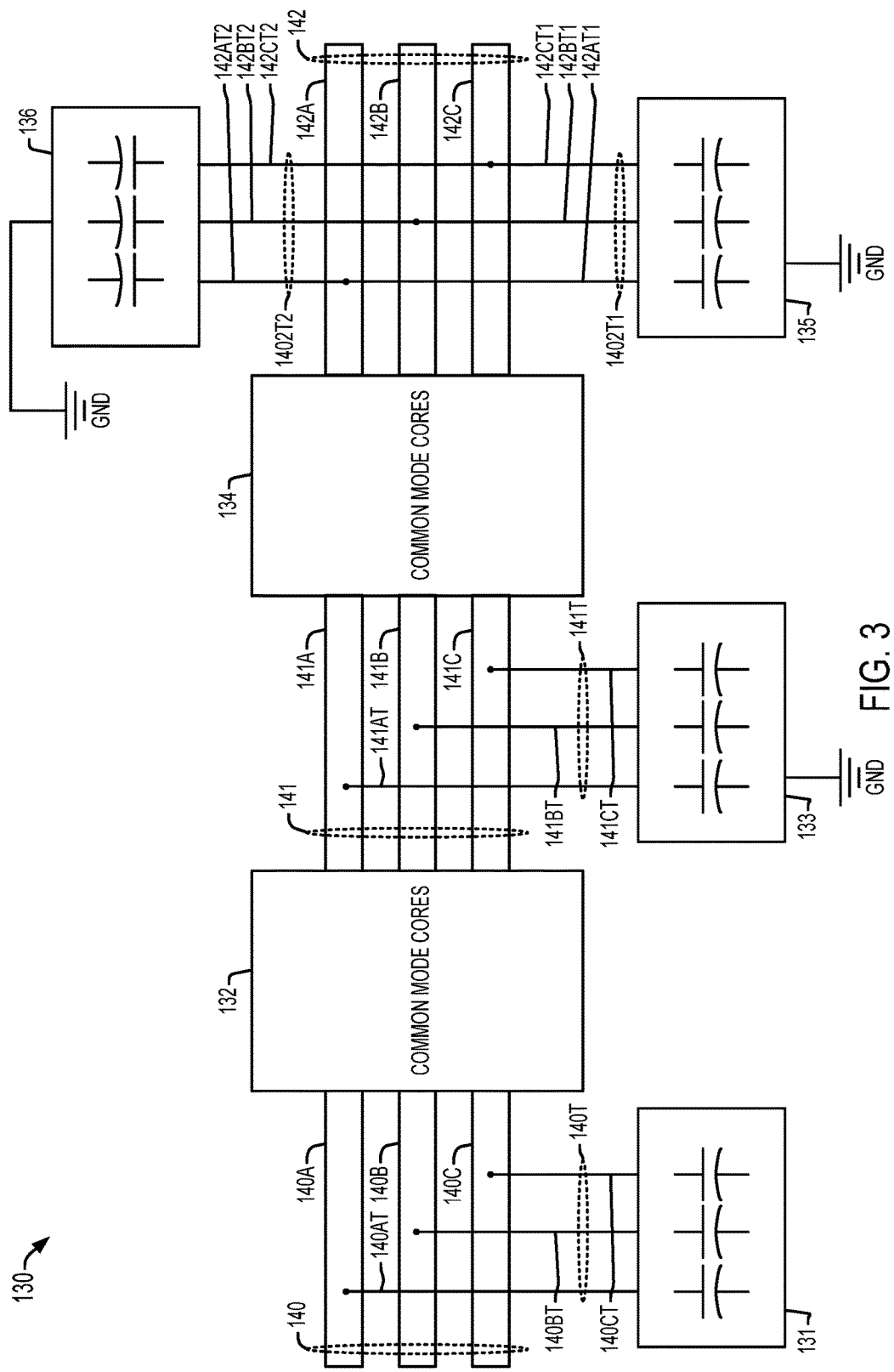
FIG. 3 is a schematic diagram.

Referring also to FIGS. 2-6, the filter 130 in the illustrated three phase example includes a filter input 140 with three filter input terminals 140A, 140B, and 140C, as well as a filter output 142 with three filter output terminals 142A, 142B, and 142C coupled with the rectifier input A, B, and C, respectively. FIG. 2 shows a schematic diagram of the example 3 phase filter 130 connected to the source 104. FIG. 3 is a partial schematic representation of the filter 130, including conductive bus bars that extend from a first end (e.g., on the left in FIG. 3) to a second end (e.g., on the right in FIG. 3).

The filter 130 includes three conductive busbars individually including the first end connected to a corresponding one of the filter input terminals 140A, 140B, and 140C, and the second end connected to a corresponding one of the three filter output terminals 142A, 142B, and 142C. In one example, the busbars are individually continuous conductive structures (e.g., metal) that extend between the first and second ends, with different locations along the lengths of the busbars as described further below. The example filter 130 includes a cascade of circuits configured along the lengths of the busbars, including a first capacitor circuit 131 followed by a first inductor circuit 132, a second capacitor circuit 133 followed by a second inductor circuit 134, and third and fourth capacitor circuits connected to the seconds ends of the busbars.

Figure 6:
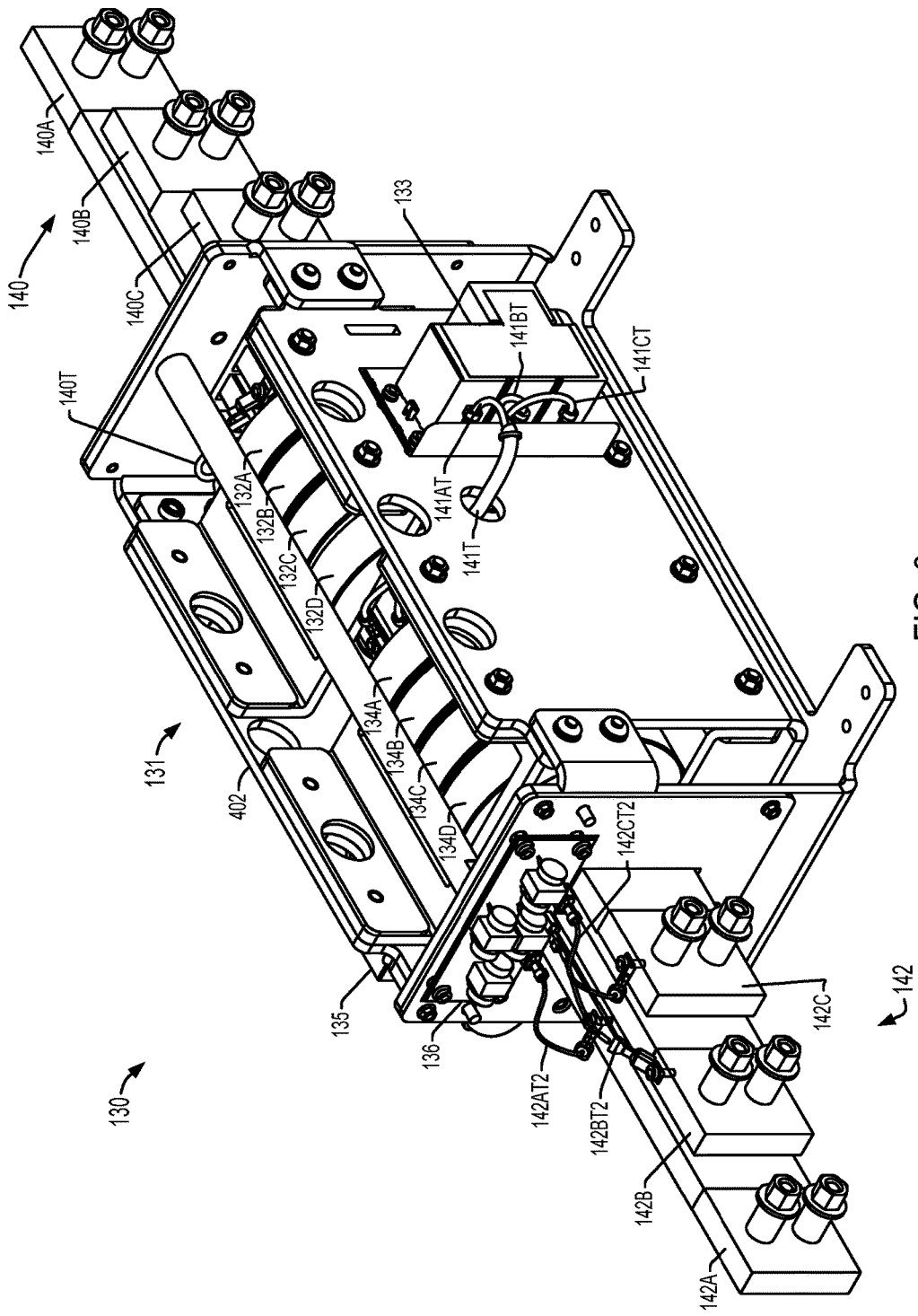
FIG. 6 is a perspective view.

As best shown in FIGS. 2 and 3, the example three phase filter 130 includes a first capacitor circuit 131 with three first capacitors C1A, C1B, and C1C individually coupled in a Y-circuit between a first common connection 131CC and a corresponding one of the busbars at a first location proximate the filter input terminals 140A, 140B, and 140C. The first capacitors C1A, C1B, and C1C of the first capacitor circuit 131 are respectively connected with the corresponding busbars by tap connections 140AT, 140BT, and 140CT (collectively 140T). In one example, as shown in FIG. 6 below, the tap connections 140T, and the other tap connections of further capacitor circuits in the filter 130, include short wires to facilitate reduced parasitics and to enhance high-frequency (e.g., EMI) frequency reduction by the filter 130.

The filter 130 further includes a first inductor circuit 132 with first common mode cores 132A, 132B, 132C, and 132D that individually extend around (e.g., encircle) the busbars at a second location between the first location and the second end of the busbars. The second capacitor circuit 133 includes second capacitors C2A, C2B, and C2C individually coupled between a second common connection 133CC and a corresponding one of the busbars at a third location 141 between the second location and the second end of the busbars. The second capacitors C2A, C2B, and C2C of the second capacitor circuit 133 are respectively connected with the corresponding busbars by tap connections 141AT, 141BT, and 141CT (collectively 141T).

The second inductor circuit 134 includes second common mode cores 134A, 134B, 134C, and 134D that individually extend around the busbars at a fourth location between the third location and the second end of the busbars. In one example, the first common mode cores 132A, 132B, 132C, and 132D and the second common mode cores 134A, 134B, 134C, and 134D include a nanocrystalline material. Suitable examples include soft magnetic cores T60006-L2102-W468-07—available from VAC Vacuumschmelze (e.g., Vacuumschmelze nano-crystalline Vitroperm common mode cores).

The third capacitor circuit 135 includes a plurality of third capacitors C3A, C3B, and C3C that are individually coupled between a third common connection 135CC and a corresponding one of the busbars at a fifth location between the fourth location and the second end of the busbars. The third capacitors C3A, C3B, and C3C of the third capacitor circuit 135 are respectively connected with the corresponding busbars by tap connections 142AT1, 142BT1, and 142CT1 (collectively 142T1).

The fourth capacitor circuit 136 includes fourth capacitors C4A, C4B, and C4C that are individually coupled between a fourth common connection 136CC and a corresponding one of the busbars at the fifth location. In the illustrated example, the second, third, and fourth common connections 133CC, 135CC, and 136CC are each coupled to a common reference node GND, although not required of all possible implementations. The fourth capacitors C4A, C4B, and C4C of the fourth capacitor circuit 136 are respectively connected with the corresponding busbars by tap connections 142AT2, 142BT2, and 142CT2 (collectively 142T2).

As shown in FIGS. 2 and 3, the second capacitor circuit 133 includes a second grounding capacitor C2G connected between the second common connection 133CC and the common reference node GND. The third capacitor circuit 135 includes a third grounding capacitor C3G connected between the third common connection 135CC and the common reference node GND, and the fourth capacitor circuit 136 includes a fourth grounding capacitor C4G connected between the fourth common connection 136CC and the common reference node GND.

In the illustrated filter 130, the first, second and third capacitor circuits 131, 133, and 135 are low-frequency capacitor circuits, implemented as capacitor circuit boards connected by the corresponding taps to the busbars. In this example, the fourth capacitor circuit 136 is a high frequency capacitor circuit implemented as a high frequency capacitor circuit board connected by corresponding tap wires to the second ends 142 of the busbars. In one example, the first capacitor circuit 131, the first inductor circuit 132, the second capacitor circuit 133, the second inductor circuit 134, and the third capacitor circuit 135 form a band stop filter with a cut-in frequency of 150 kHz or less, and a cut-off frequency of 3 MHz to 10 MHz. In this example, the fourth capacitor circuit 136 forms a low pass filter with a cutoff frequency of 3 MHz to 10 MHz. In one example, the first capacitors C1A, C1B, C1C, the second capacitors C2A, C2B, C2C, and the third capacitors C3A, C3B, C3C have capacitance values of 4.7 μF, and the individual fourth capacitors C4A, C4B, C4C each include a 0.1 μF capacitor connected in series with a 2200 nF capacitor (as schematically shown in FIG. 2). Other component values can be used and tailored, in combination with inductance values of the inductor circuits 132 and 134, in order to achieve a desired filter performance for the system 100.

Figure 7:
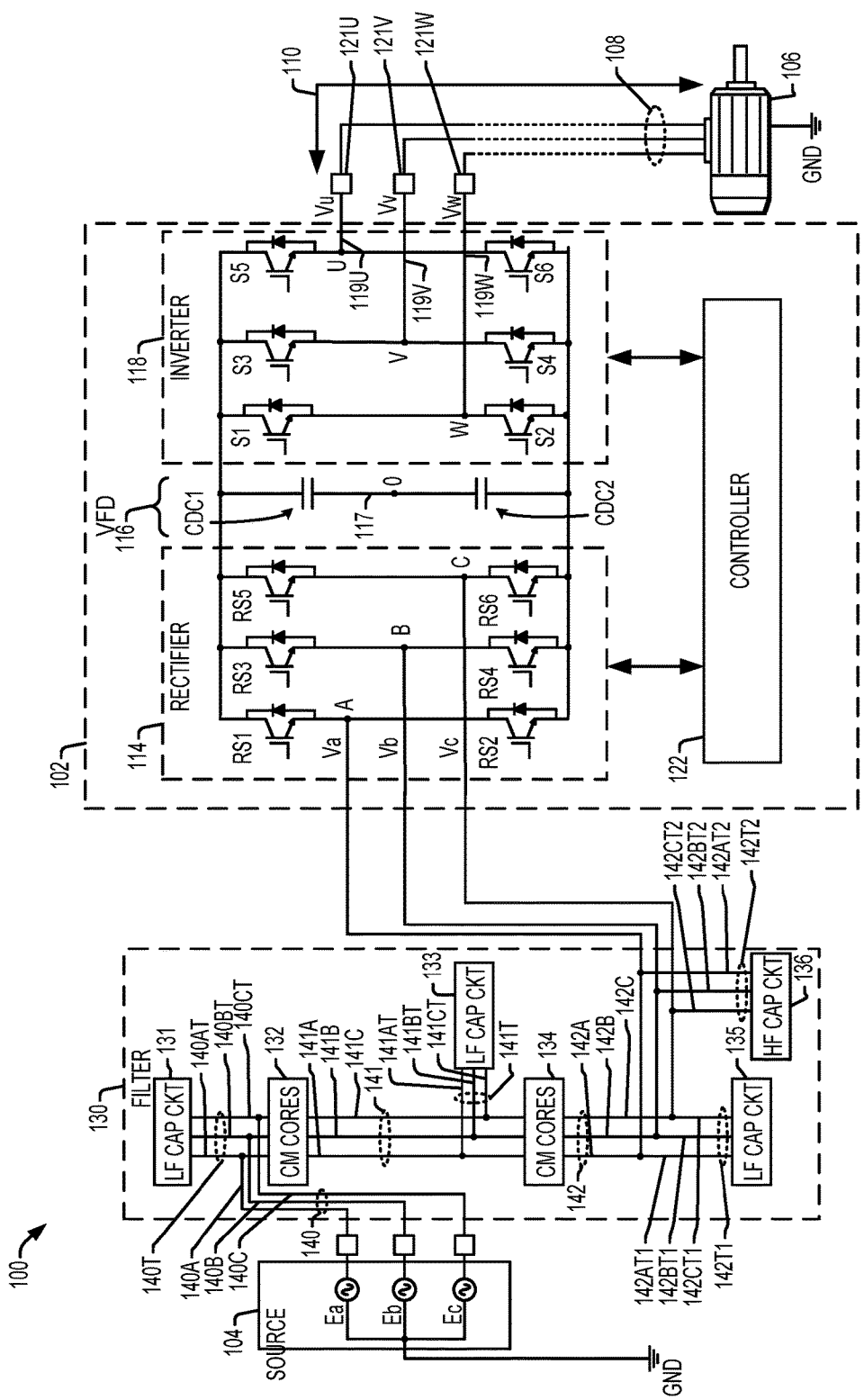
FIG. 7 is a schematic diagram.

In operation, the filter 130 attenuates EMI and other high frequency components above the range of the PWM switching frequencies of the switching rectifier 114 and the inverter 118. In the example of FIG. 1, the second filter 112 is designed to attenuate frequency content at or near the PWM switching frequencies of the rectifier 114 and the inverter 118. In combination with the filter 130, the filter system of FIG. 1 advantageously protects the source 104 (e.g., and any associated grid connections) from EMI and PWM switching frequency content associated with the power conversion system 100. FIG. 7 shows another example in which the second filter 112 is omitted.

Figure 4:
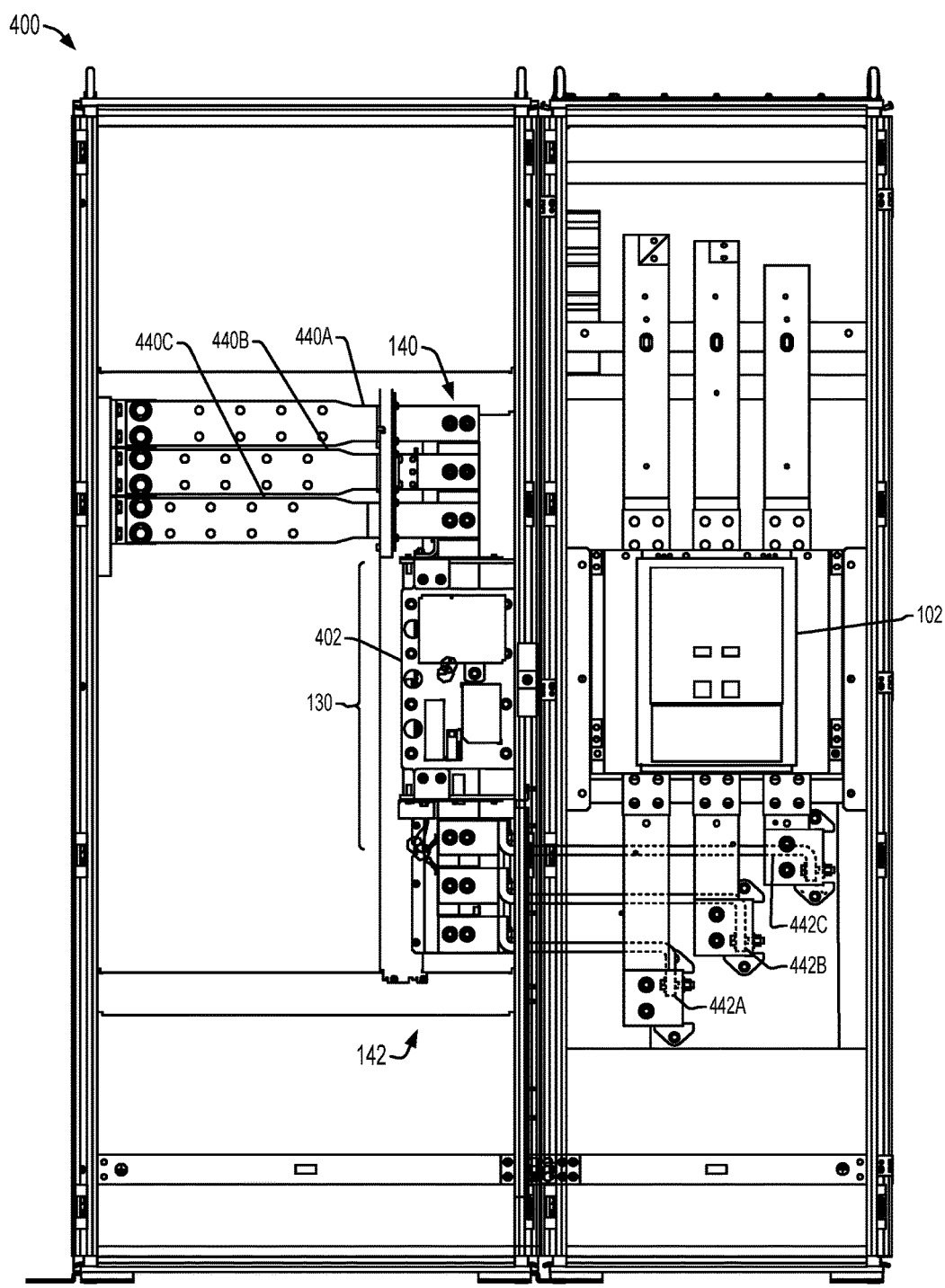
FIG. 4 is a side elevation view.

FIG. 4 shows a front view of an example implementation, including an enclosure 14 with multiple cabinets, two of which are illustrated in the drawing. This example includes a first cabinet (on the right in FIG. 4) that houses the motor drive 102 including the rectifier 114 and the inverter 118 (and any included second filter 112). The example of FIG. 4 also includes a second cabinet (on the right) that houses the filter 130. The filter 130 includes an aluminum frame 402 as shown in FIG. 4. In this example, input power (e.g., from the source 104 in FIG. 1) is provided along three horizontally extending busbars (labeled 440A, 440B, and 440C) connected to the three busbars at the input 140 of the filter 130. Power flows downward through the filter 130 to the filter output 142. The busbars of the filter 130 are connected at the output 142 to horizontal busbars (labeled 442A, 442B and 442C) to transition from the second cabinet to the first cabinet. In the first cabinet, the filter outputs are coupled to vertical busbars (not labeled in FIG. 4) that provide an input to the motor drive 102 (e.g., three phase inputs to the rectifier 114 directly as shown in FIG. 7 or through any included second filter 112 as schematically shown in FIG. 1).

Figure 5:
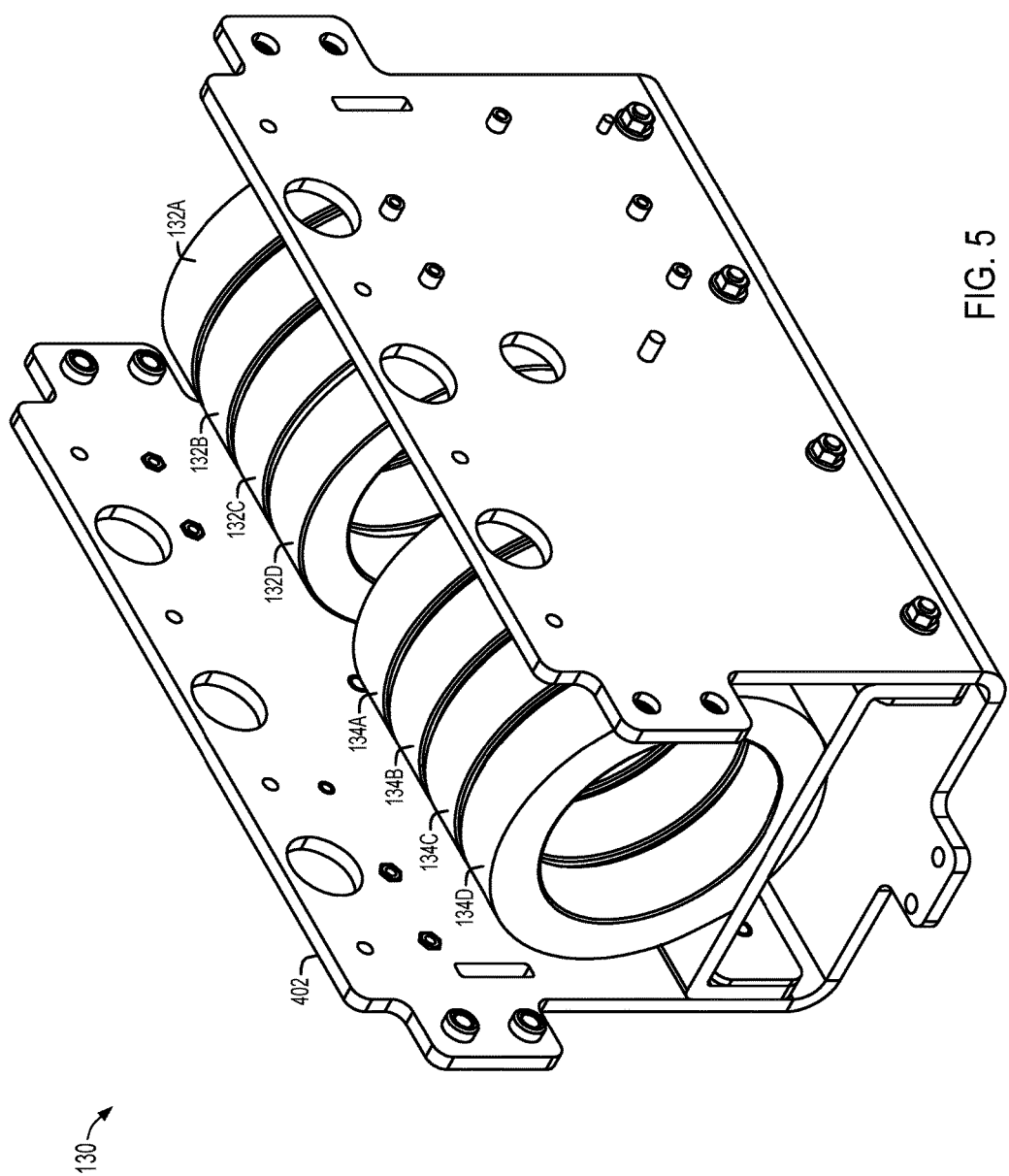
FIG. 5 is a perspective view.

FIG. 5 illustrates location of the first common mode cores 132A, 132B, 132C, and 132D and the second common mode cores 134A, 134B, 134C, and 134D within the frame 402 prior to installation encircling the busbars of the filter 130. FIG. 6 illustrates the assembled filter assembly 130, including the busbars that extend from the filter input 140 (upper right in FIG. 6) to the filter output 142 (lower left in FIG. 6). The perspective view of FIG. 6 illustrates portions of wired tap connections, including the first wired tap connection 140 of the first capacitor circuit 131 (e.g., a circuit board mounted on the back of the frame 402, out of view in FIG. 6) to the first location along the busbars. The second capacitor circuit board 133 is shown on the front side of the frame 402 in FIG. 6, including the tap connections collectively denoted 141T, including three individual tap connection wires 141AT, 141BT, and 141CT. The third tap connection from the third capacitor circuit 135 (on the back side of the frame 402) is not shown in the perspective view of FIG. 6. The high-frequency fourth capacitor circuit 136 is shown mounted to the end of the frame 402 in FIG. 6, including short tap wire connections 142AT2, 142BT2, and 142CT2. The use of short tap wires in the filter 130 facilitates reduced parasitic inductances in the filter. Moreover, as shown in FIG. 4, the construction of the filter 130 allows easy installation into existing cabinet-mounted power conversion systems, for example, to retrofit existing installations for improved EMI performance.

Prior to the innovations of the present disclosure, EMI issues were either left unaddressed, particularly for high power motor drive systems (e.g., 650 hp-1800 hp), or required custom-designed filters and associated custom mounting features. Disclosed examples provide a compact solution including a filter 130 for reducing common mode emissions with various advantages, including compact size with a small footprint, the ability to add a filter as needed without occupying space within the motor drive 102 itself, and the ease of retrofit for existing motor drive installations. Specific examples can be designed to reduce conducted emissions to meet IEC 61800-3 category C2 limits or other specifications for a given application. The disclosed examples facilitate reduced EMI conducted emission levels which are particularly useful in environments which have strict limits on EMI.

In the preceding specification, various embodiments have been described with reference to the accompanying drawings. It will be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The following is claimed:

1. A power conversion system, comprising:
   a rectifier, including a rectifier input configured to receive a rectifier AC input signal, and a rectifier output configured to provide a DC output signal to a DC bus circuit;
   an inverter, including a DC input coupled with the DC bus circuit, an inverter output, and a plurality of inverter switching devices coupled between the DC input and the inverter output and configured to provide an inverter output signal at the inverter output to directly or indirectly drive a load; and
   a filter, including:
      a filter input, including a plurality of filter input terminals,
      a filter output, including a plurality of filter output terminals coupled with the rectifier input,
      a plurality of conductive busbars individually including a first end connected to a corresponding one of the plurality of filter input terminals, and a second end connected to a corresponding one of the plurality of filter output terminals,
      a first capacitor circuit, including a plurality of first capacitors individually coupled between a first common connection and a corresponding one of the busbars at a first location proximate the plurality of filter input terminals,
      a first inductor circuit, including a plurality of first common mode cores that individually extend around the plurality of busbars at a second location between the first location and the second end of the busbars,
      a second capacitor circuit, including a plurality of second capacitors individually coupled between a second common connection and a corresponding one of the busbars at a third location between the second location and the second end of the busbars,
      a second inductor circuit, including a plurality of second common mode cores that individually extend around the busbars at a fourth location between the third location and the second end of the busbars,
      a third capacitor circuit, including a plurality of third capacitors individually coupled between a third common connection and a corresponding one of the busbars at a fifth location between the fourth location and the second end of the busbars, and
      a fourth capacitor circuit, including a plurality of fourth capacitors individually coupled between a fourth common connection and a corresponding one of the busbars at the fifth location.

2. The power conversion system of claim 1, wherein the rectifier is an active rectifier that further includes a plurality of rectifier switching devices coupled between the rectifier input and the rectifier output.

3. The power conversion system of claim 1, further comprising a second filter connected between the filter output and the rectifier input.

4. The power conversion system of claim 1, wherein the second, third, and fourth common connections are each coupled to a common reference node.

5. The power conversion system of claim 4,
   wherein the second capacitor circuit includes a second grounding capacitor connected between the second common connection and the common reference node;
   wherein the third capacitor circuit includes a third grounding capacitor connected between the third common connection and the common reference node; and
   wherein the fourth capacitor circuit includes a fourth grounding capacitor connected between the fourth common connection and the common reference node.

6. The power conversion system of claim 1, wherein the first common mode cores and the second common mode cores include a nanocrystalline material.

7. The power conversion system of claim 1,
   wherein the first capacitor circuit, the first inductor circuit, the second capacitor circuit, the second inductor circuit, and the third capacitor circuit form a band stop filter with a cut-in frequency of 150 kHz or less, and a cut-off frequency of 3 MHz to 10 MHz; and
   wherein the fourth capacitor circuit forms a low pass filter with a cutoff frequency of 3 MHz to 10 MHz.

8. The power conversion system of claim 7, wherein the first capacitors, the second capacitors, and the third capacitors have capacitance values of 4.7 µF.

9. The power conversion system of claim 8, wherein the individual fourth capacitors each include a 0.1 µF capacitor connected in series with a 2200 nF capacitor.

10. The power conversion system of claim 1, further comprising an enclosure with a first cabinet that houses the rectifier and the inverter, and a second cabinet that houses the filter.

11. A filter, comprising:
   a filter input, including a plurality of filter input terminals;
   a filter output, including a plurality of filter output terminals;
   a plurality of conductive busbars individually including a first end connected to a corresponding one of the plurality of filter input terminals, and a second end connected to a corresponding one of the plurality of filter output terminals;
   a first capacitor circuit, including a plurality of first capacitors individually coupled between a first common connection and a corresponding one of the busbars at a first location proximate the plurality of filter input terminals;
   a first inductor circuit, including a plurality of first common mode cores that individually extend around the plurality of busbars at a second location between the first location and the second end of the busbars;
   a second capacitor circuit, including a plurality of second capacitors individually coupled between a second common connection and a corresponding one of the busbars at a third location between the second location and the second end of the busbars;
   a second inductor circuit, including a plurality of second common mode cores that individually extend around the busbars at a fourth location between the third location and the second end of the busbars;
   a third capacitor circuit, including a plurality of third capacitors individually coupled between a third common connection and a corresponding one of the busbars at a fifth location between the fourth location and the second end of the busbars; and a fourth capacitor circuit, including a plurality of fourth capacitors individually coupled between a fourth common connection and a corresponding one of the busbars at the fifth location.

12. The filter of claim 11, wherein the second, third, and fourth common connections each coupled to a common reference node.

13. The filter of claim 12,
wherein the second capacitor circuit includes a second grounding capacitor connected between the second common connection and the common reference node;
wherein the third capacitor circuit includes a third grounding capacitor connected between the third common connection and the common reference node; and
wherein the fourth capacitor circuit includes a fourth grounding capacitor connected between the fourth common connection and the common reference node.

14. The filter of claim 12, wherein the first common mode cores and the second common mode cores include a nanocrystalline material.

15. The filter of claim 12,
wherein the first capacitor circuit, the first inductor circuit, the second capacitor circuit, the second inductor circuit, and the third capacitor circuit form a band stop filter with a cut-in frequency of 150 kHz or less, and a cut-off frequency of 3 MHz to 10 MHz; and
wherein the fourth capacitor circuit forms a low pass filter with a cutoff frequency of 3 MHz to 10 MHz.

16. The filter of claim 11, wherein the first common mode cores and the second common mode cores include a nanocrystalline material.

17. The filter of claim 11,
wherein the first capacitor circuit, the first inductor circuit, the second capacitor circuit, the second inductor circuit, and the third capacitor circuit form a band stop filter with a cut-in frequency of 150 kHz or less, and a cut-off frequency of 3 MHz to 10 MHz; and
wherein the fourth capacitor circuit forms a low pass filter with a cutoff frequency of 3 MHz to 10 MHz.

18. The filter of claim 17, wherein the first capacitors, the second capacitors, and the third capacitors have capacitance values of 4.7 µF.

19. The filter of claim 18, wherein the individual fourth capacitors each include a 0.1 µF capacitor connected in series with a 2200 nF capacitor.

20. The filter of claim 17, wherein the first common mode cores and the second common mode cores include a nanocrystalline material.

* * * * *